(12) United States Patent
Hayashi et al.

(10) Patent No.: US 9,431,444 B2
(45) Date of Patent: Aug. 30, 2016

(54) SINGLE-PLATE COLOR IMAGING ELEMENT INCLUDING COLOR FILTERS ARRANGED ON PIXELS

(71) Applicant: FUJIFILM Corporation, Tokyo (JP)

(72) Inventors: Kenkichi Hayashi, Saitama (JP); Seiji Tanaka, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 309 days.

(21) Appl. No.: 13/887,024

(22) Filed: May 3, 2013

(65) Prior Publication Data

US 2013/0240715 A1 Sep. 19, 2013

Related U.S. Application Data

(63) Continuation of application No. 13/560,403, filed on Jul. 27, 2012, now Pat. No. 8,456,553, which is a continuation of application No. PCT/JP2011/067418, filed on Jul. 29, 2011.

(30) Foreign Application Priority Data

Feb. 21, 2011 (JP) .................. 2011-034627
Jul. 25, 2011 (JP) .................. 2011-162415

(51) Int. Cl.
*H01J 40/14* (2006.01)
*H01L 27/146* (2006.01)
(Continued)

(52) U.S. Cl.
CPC ... *H01L 27/14625* (2013.01); *H01L 27/14621* (2013.01); *H04N 5/3458* (2013.01); *H04N 5/3537* (2013.01); *H04N 9/045* (2013.01); *H04N 2209/045* (2013.01)

(58) Field of Classification Search
CPC ........... H01L 27/146; H01L 27/14621; H01L 27/14625; H04N 5/3458; H04N 5/3537; H04N 9/045; H04N 2209/045
USPC ................... 250/226, 208.1; 348/273, 280
See application file for complete search history.

(56) References Cited

U.S. PATENT DOCUMENTS 5,604,530 A   2/1997   Saito et al.
6,343,146 B1  1/2002   Tsuruoka et al.
(Continued)

FOREIGN PATENT DOCUMENTS

EP   1 357 760 A1   10/2003
EP   1793620 A1    6/2007
(Continued)

OTHER PUBLICATIONS

Russian Decision on Grant for Russian Application No. 2013138724/07, dated Dec. 11, 2014, with an English translation.
(Continued)

*Primary Examiner* — Georgia Y Epps
*Assistant Examiner* — Kevin Wyatt
(74) *Attorney, Agent, or Firm* — Birch, Stewart, Kolasch & Birch, LLP

(57) ABSTRACT

A color imaging element including color filters arranged on pixels, wherein the color filter array includes a basic array pattern including first filters corresponding to a first color that most contributes to obtaining luminance signals and second filters corresponding to two or more second colors other than the first color, the basic array pattern repeatedly arranged in the horizontal and vertical directions, one or more first filters are arranged in each line in horizontal, vertical, and oblique directions of the color filter array, one or more second filters are arranged in each line in the horizontal and vertical directions of the color filter array in the basic array pattern, and a proportion of the number of pixels of the first color corresponding to the first filters is greater than proportions of the numbers of pixels of each color of the second colors corresponding to the second filters.

14 Claims, 9 Drawing Sheets

(51) Int. Cl.
*H04N 5/345* (2011.01)
*H04N 5/353* (2011.01)
*H04N 9/04* (2006.01)

(56) References Cited

U.S. PATENT DOCUMENTS

| | | | |
|---|---|---|---|
| 6,456,325 B1* | 9/2002 | Hayashi | H04N 9/646 348/234 |
| 6,995,796 B2 | 2/2006 | Taubman | |
| 7,027,091 B1 | 4/2006 | Reyneri et al. | |
| 7,123,299 B1* | 10/2006 | Yoshida | H04N 9/045 348/272 |
| 7,146,042 B2 | 12/2006 | Chen | |
| 7,755,682 B2 | 7/2010 | Lin | |
| 8,164,042 B2* | 4/2012 | Tseng | H01L 27/14621 250/226 |
| 2002/0054208 A1* | 5/2002 | Goldstein | G02B 21/22 348/59 |
| 2002/0149686 A1 | 10/2002 | Taubman | |
| 2003/0133028 A1 | 7/2003 | Morinaka et al. | |
| 2004/0109068 A1 | 6/2004 | Mitsunaga et al. | |
| 2004/0169747 A1 | 9/2004 | Ono et al. | |
| 2006/0087567 A1* | 4/2006 | Guarnera et al. | 348/223.1 |
| 2006/0114526 A1 | 6/2006 | Hasegawa | |
| 2006/0139468 A1 | 6/2006 | Wada | |
| 2006/0203113 A1 | 9/2006 | Wada et al. | |
| 2007/0013786 A1 | 1/2007 | Chiba et al. | |
| 2007/0153104 A1 | 7/2007 | Ellis-Monaghan et al. | |
| 2008/0151083 A1* | 6/2008 | Hains | H04N 9/045 348/273 |
| 2008/0247671 A1 | 10/2008 | Yasuma et al. | |
| 2009/0066821 A1 | 3/2009 | Achong et al. | |
| 2010/0265352 A1 | 10/2010 | Nashizawa | |
| 2010/0302423 A1 | 12/2010 | Adams, Jr. et al. | |
| 2011/0019041 A1* | 1/2011 | Ishiwata et al. | 348/280 |
| 2011/0069189 A1 | 3/2011 | Venkataraman et al. | |
| 2011/0234842 A1* | 9/2011 | Ishiga | 348/223.1 |
| 2012/0025060 A1 | 2/2012 | Iwata | |
| 2012/0293694 A1 | 11/2012 | Hayashi et al. | |
| 2012/0293696 A1 | 11/2012 | Tanaka | |
| 2014/0204249 A1* | 7/2014 | Okigawa | H01L 27/14621 348/280 |

FOREIGN PATENT DOCUMENTS

| | | |
|---|---|---|
| JP | 2-210996 A | 8/1990 |
| JP | 8-23542 A | 1/1996 |
| JP | 8-23543 A | 1/1996 |
| JP | 11-285012 A | 10/1999 |
| JP | 2000-308080 A | 11/2000 |
| JP | 2004-221839 A | 8/2004 |
| JP | 2004-266369 A | 9/2004 |
| JP | 2005-136766 A | 5/2005 |
| JP | 2006-157600 A | 6/2006 |
| JP | 2007-184904 A | 7/2007 |
| JP | 2007-306490 A | 11/2007 |
| JP | 2008-236620 A | 10/2008 |
| JP | 2010-512048 A | 4/2010 |
| JP | 2010-153511 A | 7/2010 |
| JP | 2011-523538 A | 8/2011 |
| JP | 5054858 B1 | 10/2012 |
| RU | 2383967 C2 | 3/2010 |
| WO | WO 00/16261 A1 | 3/2000 |
| WO | WO 02/056604 A1 | 7/2002 |
| WO | WO 2008/066698 A2 | 6/2008 |
| WO | WO 2009/151903 A2 | 12/2009 |

OTHER PUBLICATIONS

ISR & Written Opinion in PCT/JP2012/080898 (English translation is attached).
ISR & Written Opinion in PCT/JP2012/080899 (English translation is attached).
ISR & Written Opinion in PCT/JP2012/081644 (English translation is attached).
ISR & Written Opinion in PCT/JP2012/083583 (English translation is attached).
Extended European Search Report, issued Jul. 30, 2014, for European Application No. 11860499.0.
Adams et al., "Color Processing in Digital Cameras," IEEE Micro, vol. 18, No. 6, Nov. 1, 1998, pp. 20-30, XP000805931.
Extended European Search Report for European Application No. 11859950.5, dated Oct. 28, 2014.
Hirakawa et al., "Spatio-Spectral Color Filter Array Design for Optimal Image Recovery," IEEE Transactions on Image Processing, vol. 17, No. 10, Oct. 2008 (Current version published Sep. 10, 2008), pp. 1876-1890, XP011234206.
Li et al., "Color Filter Arrays: A Design Methodology," May 2008, pp. 1-21, XP-002730894.
Parulski et al., "High-performance digital color video camera," Journal of Electronic Imaging, vol. 1, No. 1, Jan. 1992, pp. 35-45, XP000323326.
Russian Office Action for Russian Application No. 2013138394/07, dated Oct. 15, 2014, with an English translation.
European Office Action, dated Jul. 10, 2015, for European Patent Application No. 11859950.5.
Japanses Office Action, dated Jun. 25, 2015, for Japanese Application No. 2012-165732, with an English translation.
Japanese Office Action, dated Jun. 25, 2015, for Japanese Application No. 2012-165734, with an English translation.
Japanese Office Action dated Oct. 23, 2015, for Japanese Application No. 2012-152815 with the English translation.
European Office Action issued in European Patent Application No. 11859950.5, issued on Jun. 24, 2016.

* cited by examiner

OBLIQUE DIRECTION (NW)   VERTICAL DIRECTION   OBLIQUE DIRECTION (NW)

HORIZONTAL DIRECTION

A ARRAY    B ARRAY

SINGLE-PLATE COLOR IMAGING ELEMENT INCLUDING COLOR FILTERS ARRANGED ON PIXELS

This application is a Continuation application which priority is claimed under 35 U.S.C. §120 to U.S. application Ser. No. 13/560,403 filed on Jul. 27, 2012. Application Ser. No. 13/560,403 is a Continuation of International Application No. PCT/JP2011/067418 filed on Jul. 29, 2011, and also claims the priority benefit under 35 U.S.C. §119 of Japanese Patent Applications No. 2011-034627 filed on Feb. 21, 2011 and No. 2011-162415 filed on Jul. 25, 2011, which are hereby expressly incorporated by reference into the present application.

TECHNICAL FIELD

The present invention relates to a color imaging element, and particularly, to a color imaging element that can suppress generation of color moire and increase resolution.

BACKGROUND ART

An output image of a single-plate color imaging element is a RAW image (mosaic image). Therefore, a multi-channel image is obtained by a process of interpolating (demosaicing processing) a pixel of a missing color from a surrounding pixel. In this case, there is a problem in reproduction characteristics of a high-frequency image signal. Compared to a black and white imaging element, aliasing easily occurs in an image taken by a color imaging element, and it is important to expand a reproduction band to increase resolution while suppressing generation of color moire (false color).

A primary-color Bayer array as a color array most widely used in the single-plate color imaging element includes green (G) pixels arranged in a check pattern and red (R) and blue (B) arranged line-sequentially. Therefore, G signals have a problem of reproduction accuracy in generation of high frequency signals in oblique directions, and R and B signals have a problem of reproduction accuracy in generation of high frequency signals in horizontal and vertical directions.

A black and white vertical-striped pattern (high frequency image) as shown in FIG. 13(A) enters an imaging element in a Bayer array shown in FIG. 13(B), and the pattern is sorted into Bayer color arrays to compare the colors. As shown in FIGS. 13(C) to 13(E), R forms a light and flat color image, B forms a dark and flat color image, and G forms a light and dark mosaic color image. Although there is no density difference (level difference) between RGB with respect to the original black and white image, the image is colored depending on the color array and the input frequency.

Similarly, a black and white oblique high frequency image as shown in FIG. 14(A) enters an imaging element in a Bayer array shown in FIG. 14(B), and the image is sorted into Bayer color arrays to compare the colors. As shown in FIGS. 14(C) to 14(E), R and B form light and flat color images, while G forms a dark and flat color image. Assuming that the value of black is 0 and the value of white is the black and white oblique high frequency image turns green, because only G is 255. In this way, the oblique high frequency image cannot be correctly reproduced in the Bayer array.

In the imaging apparatus using the single-plate color imaging element, an optical low-pass filter formed by an anisotropic substance such as crystal is generally arranged on the front side of the color imaging element to prevent optically reducing the high frequency wave. However, although the coloring caused by folding of the high frequency signal can be reduced in the method, there is a problem that the resolution is reduced accordingly.

To solve the problem, a color imaging element is proposed, wherein a color filter array of the color imaging element is a three-color random array satisfying array restrictions in which an arbitrary target pixel is adjacent to three colors including the color of the target pixel on four sides of the target pixel (PTL 1).

An image sensor of a color filter array is also proposed, wherein the image sensor includes a plurality of filters with different spectral sensitivity, and first and second filters among the plurality of filters are alternately arranged in a first predetermined period in one of the diagonal directions of a pixel grid of the image sensor and are alternately arranged in a second predetermined period in the other diagonal direction (PTL 2).

A color array is further proposed, wherein in a color solid-state imaging element of three primary colors of RGB, sets of three pixels including horizontally arranged R, G, and B are arranged in a zigzag manner in the vertical direction to make appearance frequencies of RGB equal and to cause arbitrary lines (horizontal, vertical, and oblique lines) on an imaging plane to pass through all colors (PTL 3).

Furthermore, a color imaging element is also proposed, wherein R and B among the three primary colors of RGB are arranged every three pixels in horizontal and vertical directions, and G is arranged between R and B (PTL 4).

CITATION LIST

Patent Literature

{PTL 1}
Japanese Patent Application Laid-Open No. 2000-308080
{PTL 2}
Japanese Patent Application Laid-Open No. 2005-136766
{PTL 3}
Japanese Patent Application Laid-Open No. 11-285012
{PTL 4}
Japanese Patent Application Laid-Open No. 8-23543

SUMMARY OF INVENTION

Technical Problem

In the color imaging element described in PTL 1, the filter arrays are random, and each random pattern needs to be optimized in demosaicing (interpolation) processing in a later stage. There is a problem that the demosaicing processing is cumbersome. Although the random arrays are effective for color moire in a low frequency wave, the random arrays are not effective for a false color at a high frequency section.

In the image sensor described in PTL 2, the G pixels (luminance pixels) are arranged in a check pattern. Therefore, there is a problem that the pixel reproduction accuracy in a limit resolution area (particularly in oblique directions) is not excellent.

The color solid-state imaging element described in PTL 3 includes filters of all colors on arbitrary lines and has an advantage that the generation of false color can be suppressed. However, the proportions of the numbers of pixels of RGB are equal, and there is a problem that the high frequency reproducibility is lower than that in a Bayer array. In the Bayer array, the proportion of the number of pixels of G that most contributes to obtaining luminance signals is twice the proportions of the numbers of pixels of R and B.

Meanwhile, in the color imaging element described in PTL 4, the proportion of the number of pixels of G with respect to the numbers of pixels of R and B is greater than that in the Bayer array, and there are lines with only G pixels in the horizontal or vertical direction. Therefore, the color imaging element is not effective for the false color at a high frequency section in the horizontal or vertical direction.

The present invention has been made in view of the circumstances, and an object of the present invention is to provide a color imaging element that can suppress the generation of false color and increase the resolution and that can simplify the process of a later stage compared to the conventional random array.

Solution to Problem

To attain the object, an invention according to an aspect of the present invention provides a single-plate color imaging element including color filters in a predetermined color filter array arranged on a plurality of pixels formed by photoelectric conversion elements arranged in horizontal and vertical directions, wherein the color filter array includes a predetermined basic array pattern including first filters corresponding to a first color that most contributes to obtaining luminance signals and second filters corresponding to two or more second colors other than the first color, the basic array pattern repeatedly arranged in the horizontal and vertical directions, one more more first filters are arranged in each line in horizontal, vertical, and oblique (NE, NW) directions of the color filter array, one or more second filters are arranged in each line in the horizontal and vertical directions of the color filter array in the basic array pattern, and a proportion of the number of pixels of the first color corresponding to the first filters is greater than proportions of the numbers of pixels of each color of the second colors corresponding to the second filters.

According to the color imaging element of an aspect of the present invention, the first filters corresponding to the first color that most contributes to obtaining the luminance signals are arranged in each line in the horizontal, vertical, and oblique (NE, NW) directions of the color filter array. Therefore, the reproduction accuracy of the demosaicing processing in the high frequency area can be improved. One or more second filters corresponding to two or more second colors other than the first color are arranged in each line in the horizontal and vertical directions of the color filter array. Therefore, the generation of color moire (false color) can be suppressed, and the resolution can be increased.

In the color filter array, the predetermined basic array pattern is repeatedly arranged in the horizontal and vertical directions. Therefore, the demosaicing (interpolation) processing in a later stage can be executed according to the repeated pattern, and the processing in the later stage can be simplified compared to the conventional random array.

The proportion of the number of pixels of the first color corresponding to the first filters and the proportions of the numbers of pixels of each color of the second colors corresponding to the second filters are different. Particularly, the proportion of the number of pixels of the first color that most contributes to obtaining the luminance signals is greater than the proportions of the numbers of pixels of each color of the second colors corresponding to the second filters. Therefore, aliasing can be suppressed, and high frequency reproducibility is excellent.

In the color imaging element according to another aspect of the present invention, the color filter array includes a section where the first filters continue for two or more pixels in each line in the horizontal, vertical, and oblique (NE, NW) directions.

As a result, the direction with a small change in luminance (direction with high correlation) among the horizontal, vertical, and oblique (NE, NW) directions can be determined at minimum pixel intervals.

In the color imaging element according to another aspect of the present invention, the color filter array includes a square array corresponding to 2×2 pixels formed by the first filters. The pixel values of the 2×2 pixels can be used to determine the direction with a high correlation among the horizontal, vertical, and oblique (NE, NW) directions.

Preferably, in the color imaging element according to another aspect of the present invention, the color filter array in the predetermined basic array pattern is point symmetric with respect to a center of the basic array pattern. As a result, the circuit size of the processing circuit in a later stage can be reduced.

Preferably, in the color imaging element according to another aspect of the present invention, the predetermined basic array pattern is a square array pattern corresponding to N×N (N: integer 4 or more and 8 or less) pixels. When N is smaller than 4, the conditions of the color filter array according to the present invention are not satisfied. When N is greater than 8, signal processing such as demosaicing becomes complicated, while particular advantageous effects cannot be attained by increasing the size of the basic array pattern.

Preferably, in the color imaging element according to another aspect of the present invention, the predetermined basic array pattern is a square array pattern corresponding to 6×6 pixels.

As described, it is preferable that the predetermined basic array pattern is a square array pattern corresponding to N×N pixels and that N is an integer 4 or more and 8 or less. For N, an even number is more advantageous in the demosaicing processing than an odd number. When N is 4, the basic array pattern does not include a section where the first filters continue for two or more pixels in each line in the horizontal, vertical, and oblique (NE, NW) directions, which is disadvantageous in the determination of the direction with a small change in luminance. When N is 8, the signal processing is more cumbersome compared to when N is 6. Therefore, it is most preferable that N is 6 in the basic array pattern, i.e. the square array pattern corresponding to 6×6 pixels.

Preferably, in the color imaging element according to another aspect of the present invention, the color filter array includes the first filters at a center and four corners of a 3×3 pixel group, and the 3×3 pixel group is repeatedly arranged in the horizontal and vertical directions. The first filters are arranged at four corners of the 3×3 pixel group. Therefore, if the 3×3 pixel group is repeatedly arranged in the horizontal and vertical directions, the color filter array includes a square array corresponding to 2×2 pixels of the first filters. The pixel values of the 2×2 pixels can be used to determine the direction with a high correlation among the horizontal, vertical, and oblique (NE, NW) directions, and the first filters are arranged in each line in the horizontal, vertical, and oblique (NE, NW) directions of the color filter array.

In the color imaging element according to another aspect of the present invention, the second filters may be arranged in each line in the horizontal, vertical, and oblique (NE, NW) directions of the color filter array. As a result, the color reproducibility in the oblique directions can be improved.

In the color imaging element according to another aspect of the present invention, the first color is green (G), and the second colors are red (R) and blue (B).

Preferably, in the color imaging element according to another aspect of the present invention, the predetermined basic array pattern is a square array pattern corresponding to 6×6 pixels, and the color filter array includes: a first array corresponding to 3×3 pixels, the first array including G filters arranged at a center and four corners, B filters vertically arranged across the G filter at the center, and R filters horizontally arranged across the G filter at the center; and a second array corresponding to 3×3 pixels, the second array including G filters arranged at a center and four corners, R filters vertically arranged across the G filter at the center, and B filters horizontally arranged across the G filter at the center, the first and second arrays alternately arranged in the horizontal and vertical directions.

The basic array pattern includes G filters in a square array corresponding to 2×2 pixels, and the basic array pattern is in a minimum size that is point symmetric with respect to the center of the basic array pattern. According to the color filter array with the configuration, there are G pixels of 2×2 pixels at four corners of 5×5 pixels when the 5×5 pixels (local area of mosaic image) are extracted around the first or second array. The pixel values of the G pixels of the 2×2 pixels can be used to determine the correlation direction of four directions.

Advantageous Effects of Invention

According to the present invention, the first filters corresponding to the first color that most contributes to obtaining the luminance signals are arranged in each line in the horizontal, vertical, and oblique (NE, NW) directions of the color filter array, and the proportion of the number pixels of the first color corresponding to the first filters is greater than the proportions of the numbers of pixels of each color of the second colors corresponding to the second filters of two or more colors other than the first color. Therefore, the reproduction accuracy of the demosaicing processing in the high frequency area can be improved, and aliasing can be suppressed.

One or more second filters corresponding to two or more second colors other than the first color are arranged in each line in the horizontal and vertical directions of the color filter array in the basic array pattern. Therefore, the generation of color moire (false color) can be suppressed to increase the resolution.

In the color filter array according to the present invention, the predetermined basic array pattern is repeated in the horizontal and vertical directions. Therefore, the demosaicing (interpolation) processing in a later stage can be executed according to the repeated pattern, and the processing in the later stage can be simplified compared to the conventional random array.

DESCRIPTION OF EMBODIMENTS

Hereinafter, preferred embodiments of the present invention will be described in detail with reference to the attached drawings.

{First Embodiment of Color Imaging Element}

Figure 1:
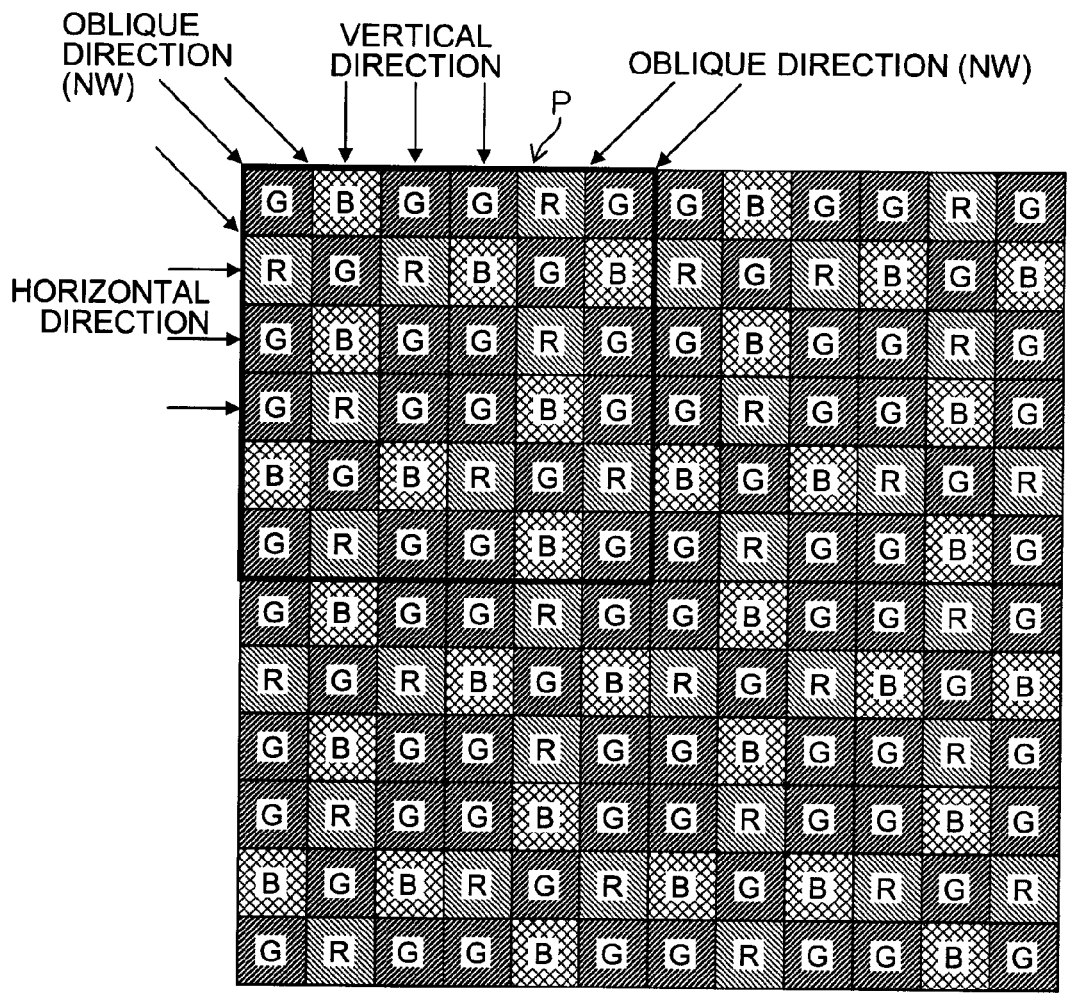
FIG. 1 is a diagram showing a first embodiment of a single-plate color imaging element according to the present invention.

FIG. 1 is a diagram showing a first embodiment of a single-plate color imaging element according to the present invention. FIG. 1 particularly shows a color filter array of color filters arranged on the color imaging element.

The color imaging element includes: a plurality of pixels (not shown) formed by photoelectric conversion elements arranged in horizontal and vertical directions (two-dimensional array); and color filters in a color filter array shown in FIG. 1 arranged on light receiving surfaces of the pixels. One of the color filters of three primary colors of red (R), green (G), and blue (B) is arranged on each pixel.

The color imaging element is not limited to a CCD (Charge Coupled Device) color imaging element and may be another type of imaging element such as a CMOS (Complementary Metal Oxide Semiconductor) imaging element.

<Features of Color Filter Array>

The color filter array of the color imaging element of the first embodiment has the following features (1), (2), (3), (4), and (5).

{Feature (1)}

The color filter array shown in FIG. 1 includes a basic array pattern P (pattern indicated by a thick frame) formed by a square array pattern corresponding to 6×6 pixels, and the basic array pattern P is repeatedly arranged in the horizontal and vertical directions. Therefore, the color filter array includes filters of each color of R, G, and B (R filters, G filters, and B filters) arranged in a predetermined cycle.

In this way, the R filters, the G filters, and the B filters are arranged in a predetermined cycle. Therefore, demosaicing (interpolation) processing and the like of R, G, and B signals read out from the color imaging element can be processed according to the repeated pattern.

When a thinning-out process is executed based on the basic array pattern P to reduce the image, the color filter array of the reduced image after the thinning-out process can be the same as the color filter array before the thinning-out process. Therefore, a common processing circuit can be used.

{Feature (2)}

In the color filter array shown in FIG. 1, the G filters corresponding to the color (color of G in the embodiment) that most contributes to obtaining luminance signals are arranged in each line in the horizontal, vertical, and oblique (NE, NW) directions of the color filter array.

The G filters corresponding to the luminance pixels are arranged in each line in the horizontal, vertical, and oblique (NE, NW) directions of the color filter array. Therefore, the reproduction accuracy of the demosaicing processing in a high frequency area can be improved regardless of the direction of the high frequency wave.

{Feature (3)}

In the basic array pattern of the color filter array shown in FIG. 1, the numbers of pixels of the R pixels, the G pixels, and the B pixels corresponding to the R, G, and B filters in the basic array pattern are eight pixels, twenty pixels, and eight pixels, respectively. Therefore, the ratio of the numbers of pixels of the RGB pixels is 2:5:2, and the proportion of the number of G pixels that most contribute to obtaining the luminance signals is greater than the proportions of the numbers of each of R and B pixels of other colors.

The proportion of the number of G pixels and the proportions of the numbers of each of R and B pixels are different, and particularly, the proportion of the number of G pixels that most contribute to obtaining the luminance signals is greater than the proportions of the numbers of each of R and B pixels. Therefore, aliasing in the demosaicing processing can be suppressed, and high frequency reproducibility can be improved.

{Feature (4)}

In the color filter array shown in FIG. 1, one or more R and B filters corresponding to two or more colors other than the color of G (colors of R and B in the embodiment) are arranged in each line in the horizontal and vertical directions of the color filter array in the basic array pattern P.

The R and B filters are arranged in each line in the horizontal and vertical directions of the color filter array. Therefore, the generation of color moire (false color) can be suppressed. As a result, it is possible not to arrange an optical low-pass filter for suppressing the generation of false color on an optical path from a plane of incident to an imaging plane of the optical system. Even if the optical low-pass filter is applied, a filter with less effect of cutting high frequency components for preventing the generation of false color can be applied, and a loss of resolution can be prevented.

Figure 2:
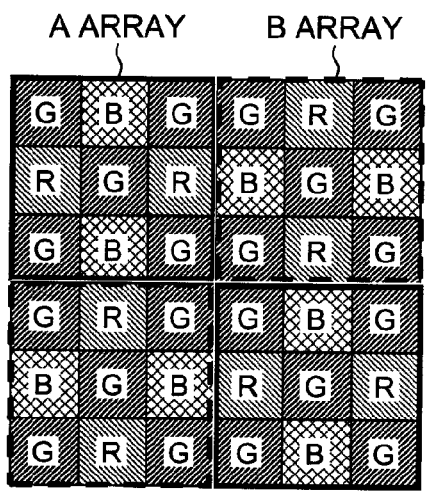
FIG. 2 is a diagram showing a basic array pattern included in a color filter array of the color imaging element according to the first embodiment.

FIG. 2 shows a state in which the basic array pattern P shown in FIG. 1 is divided into four sets of 3×3 pixels.

As shown in FIG. 2, the basic array pattern P can be perceived as a pattern including A arrays of 3×3 pixels surrounded by a frame of solid lines and B arrays of 3×3 pixels surrounded by a frame of broken lines alternately arranged in the horizontal and vertical directions.

Each of the A and B arrays includes G filters as luminance pixels arranged at four corners and a center, and the G filters are arranged on both diagonals. In the A array, the R filters are arranged in the horizontal direction, and the B filters are arranged in the vertical direction, across the G filter at the center. Meanwhile, in the B array, the B filters are arranged in the horizontal direction, and the R filters are arranged in the vertical direction, across the G filter at the center. Therefore, although the positional relationship between the R and B filters is opposite in the A and B arrays, the rest of the arrangement is the same.

Figure 3:
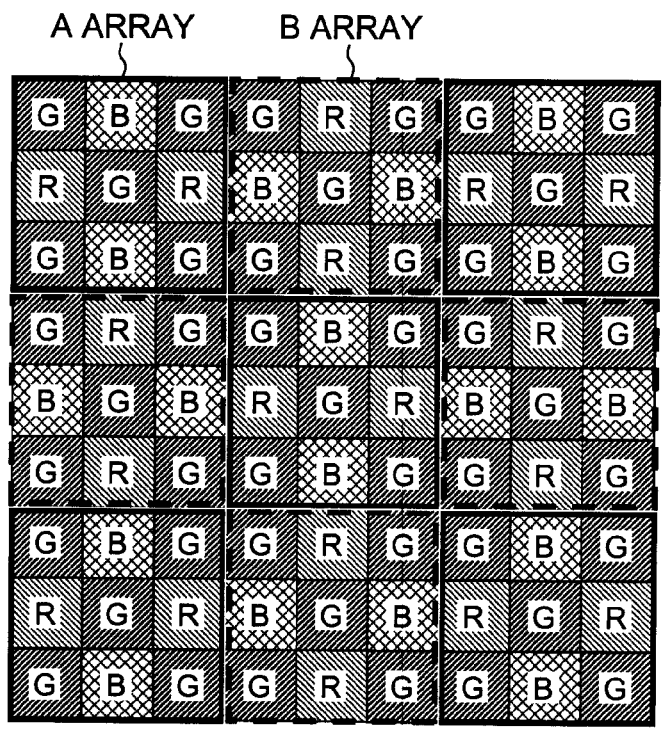
FIG. 3 is a diagram showing a state in which a basic array pattern of 6×6 pixels included in a color filter array of the color imaging element of the first embodiment is divided into A arrays and B arrays of 3×3 pixels, and the A arrays and the B arrays are arranged.

The A and B arrays are alternately arranged in the horizontal and vertical directions as shown in FIG. 3, and the G filters at four corners of the A and B arrays form G filters of square arrays corresponding to 2×2 pixels.

The G filters as luminance pixels are arranged at the four corners and the center in 3×3 pixels in the A and B arrays, and the 3×3 pixels are alternately arranged in the horizontal and vertical directions to form the G filters in the square arrays corresponding to 2×2 pixels. The arrays satisfy the features (1), (2), and (3), as well as a feature (5) described below.

{Feature (5)}

The color filter array shown in FIG. 1 includes square arrays corresponding to 2×2 pixels of G filters.

Figure 4:
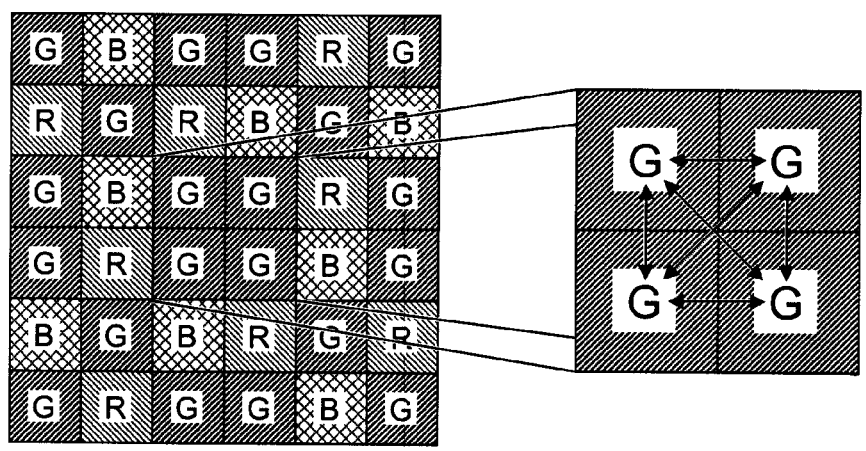
FIG. 4 is a diagram used to explain a method of determining a correlation direction from pixel values of G pixels of 2×2 pixels included in the color filter array of the color imaging element of the first embodiment.

As shown in FIG. 4, 2×2 pixels of G filters are extracted to calculate difference absolute values of the pixel values of the G pixels in the horizontal direction, difference absolute values of the pixel values of the G pixels in the vertical direction, and difference absolute values of the pixel values of the G pixels in the oblique directions (upper right oblique and upper left oblique directions). In this way, it can be determined that there is a correlation in the direction with a small difference absolute value among the horizontal, vertical, and oblique directions.

Therefore, according to the color filter array, information of the G pixels at minimum pixel intervals can be used to determine the direction with a high correlation among the horizontal, vertical, and oblique directions. The direction determination result can be used for a process of interpolation (demosaicing processing) based on surrounding pixels.

Figure 5:
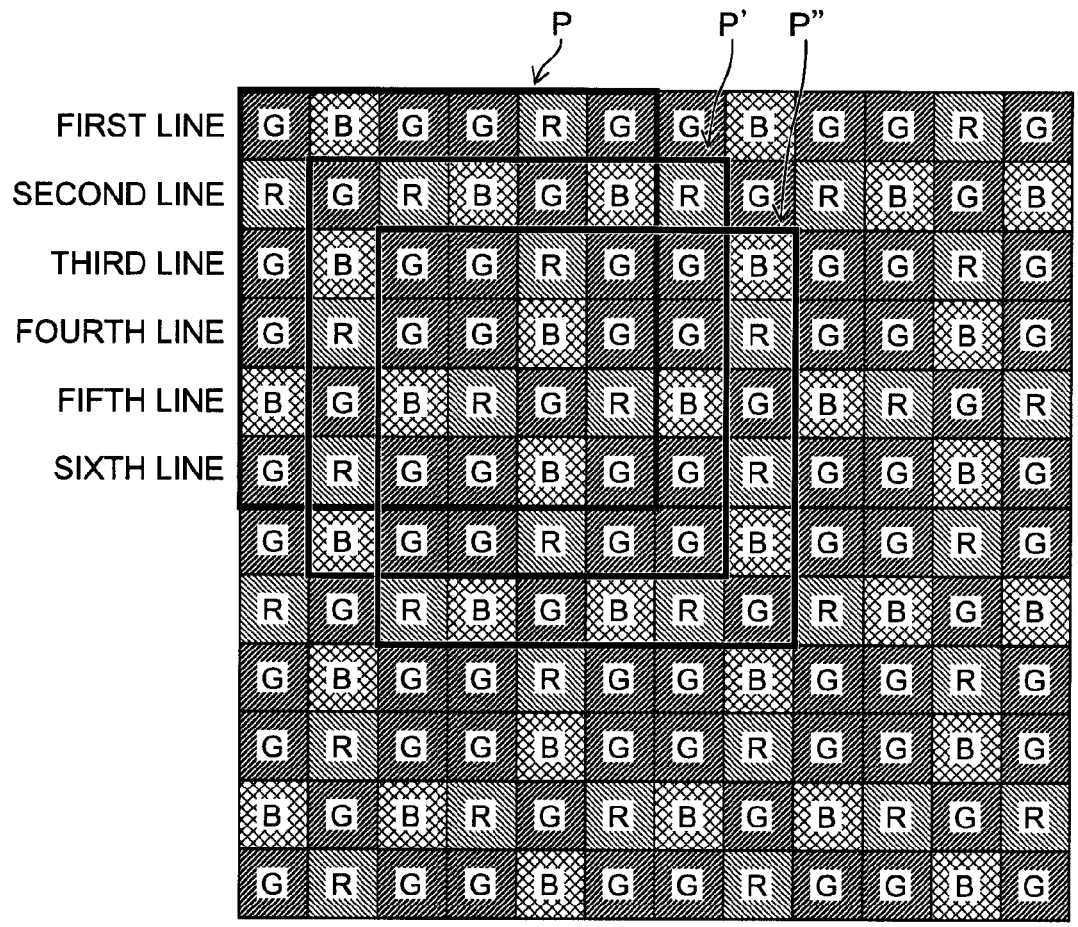
FIG. 5 is a diagram used to explain a concept of the basic array pattern included in the color filter array of the color imaging element.

When the pixels of the A or B array of 3×3 pixels are the target pixels of the demosaicing processing as shown in FIG. 3, and 5×5 pixels (local area of mosaic image) are extracted around the A or B array, there are G pixels of 2×2 pixels at four corners of the 5×5 pixels. The pixel values of the G pixels of 2×2 pixels can be used to accurately determine the correlation direction of four directions using the information of the G pixels at minimum pixel intervals.

{Feature (6)}

The basic array pattern of the color filter array shown in FIG. 1 is point symmetric with respect to the center of the basic array pattern (center of four G pixels). As shown in FIG. 2, the A and B arrays in the basic array pattern are also point symmetric with respect to the G filter at the center.

The symmetry can reduce and simplify the circuit size of a processing circuit in a later stage.

In the basic array pattern P shown by a thick frame as shown in FIG. 5, color filter arrays of first and third lines among first to sixth lines in the horizontal direction include GBGGRG, a color filter array of the second line includes RGRBGB, color filter arrays of the fourth and sixth lines include GRGGBG, and a color filter array of the fifth line includes BGBRGR.

In FIG. 5, assuming that a basic array pattern obtained by shifting the basic array pattern P by one pixel both in the horizontal and vertical directions is P' and a basic array pattern obtained by shifting the basic array pattern P by two pixels both in the horizontal and vertical directions is P''', the color filter array is the same even if the basic array patterns P' and P''' are repeatedly arranged in the horizontal and vertical directions.

Therefore, there are a plurality of basic array patterns that can form the color filter array shown in FIG. 5 by repeatedly arranging the basic array pattern in the horizontal and vertical directions. In the first embodiment, the basic array pattern P in which the basic array pattern is point symmetric is called a basic array pattern for convenience.

Although there are also a plurality of basic array patterns for each of the color filter arrays in the other embodiments described below, the representative one will be called a basic array pattern of the color filter array.

{Second Embodiment of Color Imaging Element}

Figure 6:
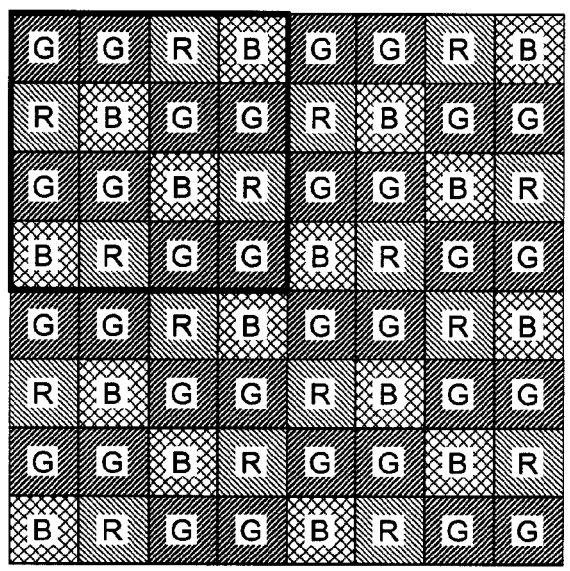
FIG. 6 is a diagram showing a second embodiment of the single-plate color imaging element according to the present invention.

FIG. 6 is a diagram showing a second embodiment of the single-plate color imaging element according to the present invention. FIG. 6 particularly shows a color filter array of color filters arranged on the color imaging element.

The color filter array of the color imaging element of the second embodiment includes a basic array pattern (pattern shown by a thick frame) formed by a square array pattern corresponding to 4×4 pixels. The basic array pattern is repeatedly arranged in the horizontal and vertical directions.

As in the first embodiment, the color filter array includes G filters arranged in each line in the horizontal, vertical, and oblique (NE, NW) directions of the color filter array and includes R and B filters arranged in each line in the horizontal and vertical directions of the color filter array.

The basic array pattern is point symmetric with respect to the center of the basic array pattern.

Meanwhile, the color filter array does not include a square array corresponding to 2×2 pixels of G filters. However, the color filter array includes G filters adjacent to each other in the horizontal direction and G filters adjacent to each other in the oblique directions (upper right oblique and upper left oblique directions).

In the vertical direction, there are G filters across the R or B filter. Therefore, the pixel values of the G pixels corresponding to the G filters can be used to determine the correlation in the vertical direction.

In the basic array pattern of the color filter array shown in FIG. 6, the numbers of pixels of the R pixels, the G pixels, and the B pixels corresponding to the R, G, and B filters in the basic array pattern are four pixels, eight pixels, and four pixels, respectively. Therefore, the ratio of the numbers of RGB pixels is 1:2:1, and the proportion of the number of G pixels that most contribute to obtaining the luminance signals is greater than the proportions of the numbers of each of R and B pixels of other colors.

As described, the color filter array of the color imaging element of the second embodiment has the same features as the features (1), (2), (3), (4), and (6) of the color filter array of the color imaging element of the first embodiment.

{Third Embodiment of Color Imaging Element}

Figure 7:
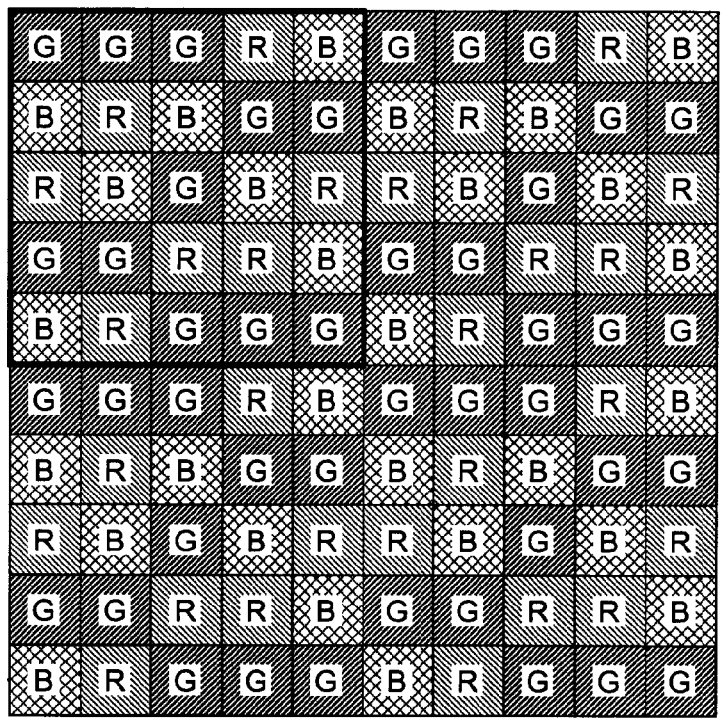
FIG. 7 is a diagram showing a third embodiment of the single-plate color imaging element according to the present invention.

FIG. 7 is a diagram showing a third embodiment of the single-plate color imaging element according to the present invention. FIG. 7 particularly shows a color filter array of color filters arranged on the color imaging element.

The color filter array of the color imaging element of the third embodiment includes a basic array pattern (pattern shown by a thick frame) formed by a square array pattern corresponding to 5×5 pixels, and the basic array pattern is repeatedly arranged in the horizontal and vertical directions.

As in the first embodiment, the color filter array includes G filters arranged in each line in the horizontal, vertical, and oblique (NE, NW) directions of the color filter array and includes R filters and B filters arranged in each line in the horizontal and vertical directions of the color filter array.

In the basic array pattern of the color filter array shown in FIG. 7, the numbers of pixels of the R pixels, the G pixels, and the B pixels corresponding to the R, G, and B filters in the basic array pattern are seven pixels, eleven pixels, and seven pixels, respectively. Therefore, the ratio of the numbers of RGB pixels is 7:11:7, and the proportion of the number of G pixels that most contribute to obtaining the luminance signals is greater than the proportions of the numbers of each of R and B pixels of other colors.

The basic array pattern is not point symmetric, and the basic array pattern does not include a square array corresponding to 2×2 pixels formed by G filters.

The color filter array of the color imaging element of the third embodiment has the same features as the features (1), (2), (3), and (4) of the color filter array of the color imaging element of the first embodiment.

{Fourth Embodiment of Color Imaging Element}

Figure 8:
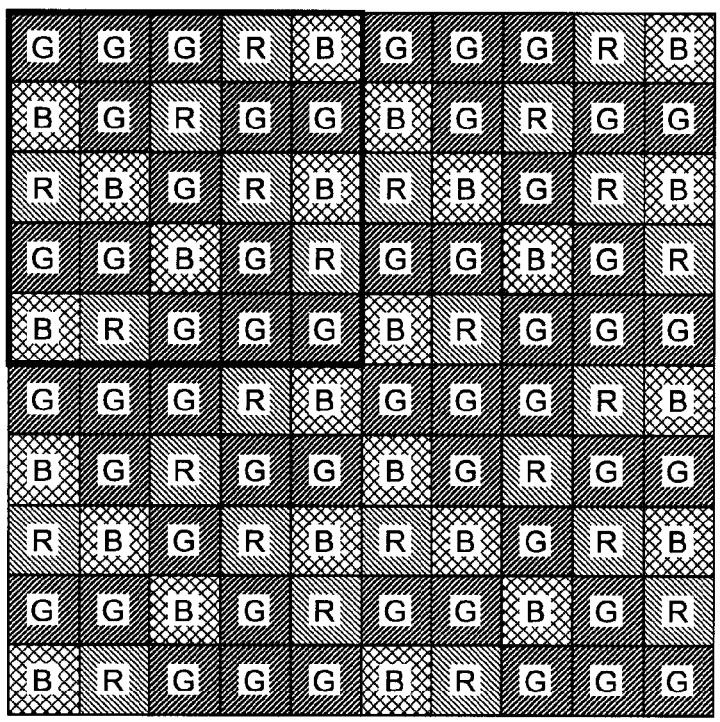
FIG. 8 is a diagram showing a fourth embodiment of the single-plate color imaging element according to the present invention.

FIG. 8 is a diagram showing a fourth embodiment of the single-plate color imaging element according to the present invention. FIG. 8 particularly shows a color filter array of color filters arranged on the color imaging element.

As in the third embodiment, the color filter array of the color imaging element of the fourth embodiment includes a basic array pattern (pattern shown by a thick frame) formed by a square array pattern corresponding to 5×5 pixels, and the basic array pattern is repeatedly arranged in the horizontal and vertical directions.

As in the first embodiment, the color filter array includes G filters arranged in each line in the horizontal, vertical, and oblique (NE, NW) directions of the color filter array and includes R and B filters arranged in each line in the horizontal and vertical directions of the color filter array.

In the basic array pattern of the color filter array shown in FIG. 8, the numbers of pixels of the R pixels, the G pixels, and the B pixels corresponding to the R, G, and B filters in the basic array pattern are six pixels, thirteen pixels, and six pixels, respectively. Therefore, the ratio of the numbers of RGB pixels is 6:13:6, and the proportion of the number of G pixels that most contribute to obtaining the luminance signals is greater than the proportions of the numbers of each of R and B pixels of other colors.

Although the color filter array does not include a square array corresponding to 2×2 pixels of G filters, the color filter array includes a set of four pixels with G filters adjacent to each other. The correlation in the horizontal, vertical, and oblique directions can be determined at minimum pixel intervals based on the pixels values of the four pixels. The basic array pattern is not point symmetric.

The color filter array of the color imaging element of the fourth embodiment has the same features as the features (1), (2), (3), (4), and (5) of the color filter array of the color imaging element of the first embodiment.

{Fifth Embodiment of Color Imaging Element}

Figure 9:
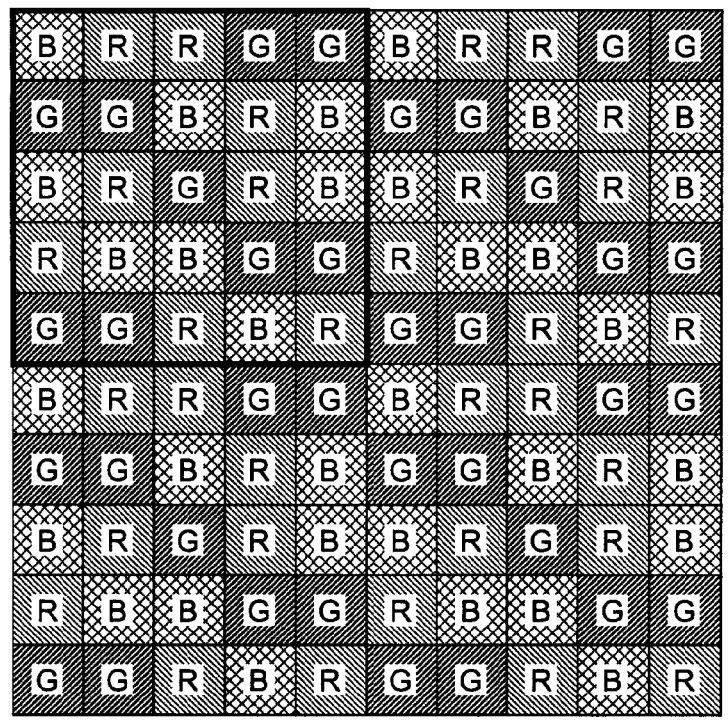
FIG. 9 is a diagram showing a fifth embodiment of the single-plate color imaging element according to the present invention.

FIG. 9 is a diagram showing a fifth embodiment of the single-plate color imaging element according to the present invention. FIG. 9 particularly shows a color filter array of color filters arranged on the color imaging element.

As in the third embodiment, the color filter array of the color imaging element of the fifth embodiment includes a basic array pattern (pattern shown by a thick frame) formed by a square array pattern corresponding to 5×5 pixels, and the basic array pattern is repeatedly arranged in the horizontal and vertical directions.

The color filter array includes G filters arranged in each line in the horizontal, vertical, and oblique (NE, NW) directions of the color filter array and includes R and B filters arranged in each line in the horizontal, vertical, and oblique (NE, NW) directions of the color filter array.

Therefore, the color filter array includes all R, G, and B filters arranged in each line in the horizontal, vertical, and oblique (NE, NW) directions of the color filter array. As a result, the color reproducibility in the oblique directions can be further improved, and this is a feature not included in the color filter array of the color imaging element of the first embodiment.

In the basic array pattern of the color filter array shown in FIG. 9, the numbers of pixels of the R pixels, the G pixels, and the B pixels corresponding to the R, G, and B filters in the basic array pattern are eight pixels, nine pixels, and eight pixels, respectively. Therefore, the ratio of the numbers of RGB pixels is 8:9:8, and the proportion of the number of G pixels that most contribute to obtaining the luminance signals is greater than the proportions of the numbers of each of R and B pixels of other colors.

Meanwhile, the color filter array does not include a square array corresponding to 2×2 pixels of G filters, and the basic array pattern is not point symmetric.

The color filter array of the color imaging element of the fifth embodiment has the same features as the features (1), (2), (3), and (4) of the color filter array of the color imaging element of the first embodiment.

{Sixth Embodiment of Color Imaging Element}

Figure 10:
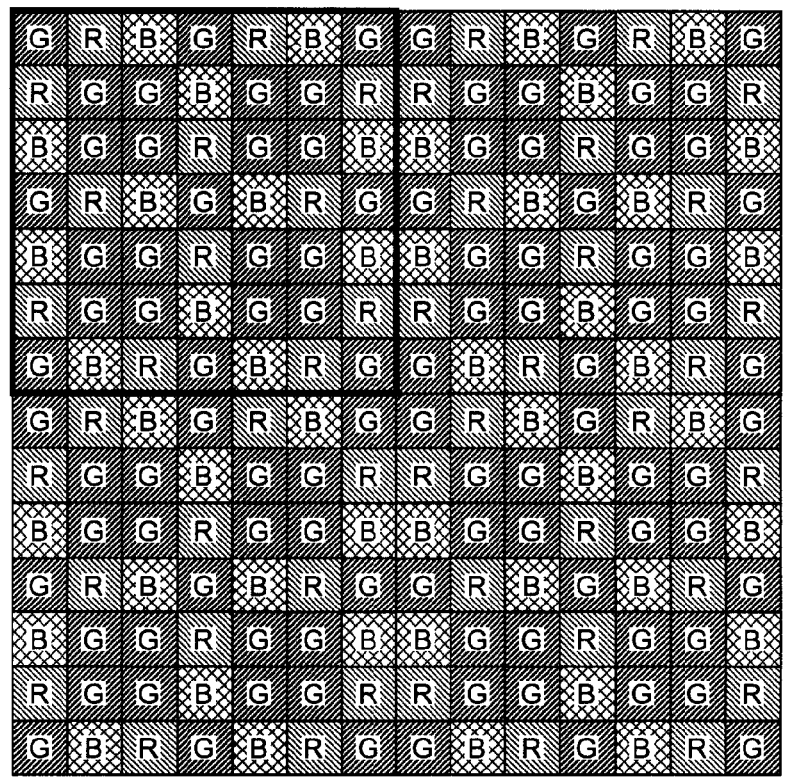
FIG. 10 is a diagram showing a sixth embodiment of the single-plate color imaging element according to the present invention.

FIG. 10 is a diagram showing a sixth embodiment of the single-plate color imaging element according to the present invention. FIG. 10 particularly shows a color filter array of color filters arranged on the color imaging element.

The color filter array of the color imaging element of the sixth embodiment includes a basic array pattern (pattern shown by a thick frame) formed by a square array pattern corresponding to 7×7 pixels, and the basic array pattern is repeatedly arranged in the horizontal and vertical directions.

As in the first embodiment, the color filter array includes G filters arranged in each line in the horizontal, vertical, and oblique (NE, NW) directions of the color filter array and includes R and B filters arranged in each line in the horizontal and vertical directions of the color filter array.

In the basic array pattern of the color filter array shown in FIG. 10, the numbers of pixels of the R pixels, the G pixels, and the B pixels corresponding to the R, G, and B filters in the basic array pattern are twelve pixels, twenty five pixels, and twelve pixels, respectively. Therefore, the ratio of the numbers of RGB pixels is 12:25:12, and the proportion of the number of G pixels that most contribute to obtaining the luminance signals is greater than the proportions of the numbers of each of R and B pixels of other colors.

The color filter array includes a square array corresponding to 2×2 pixels of G filters, and the basic array pattern is point symmetric with respect to the center of the basic array pattern.

The color filter array of the color imaging element of the sixth embodiment has the same features as the features (1), (2), (3), (4), (5), and (6) of the color filter array of the color imaging element of the first embodiment.

{Seventh Embodiment of Color Imaging Element}

Figure 11:
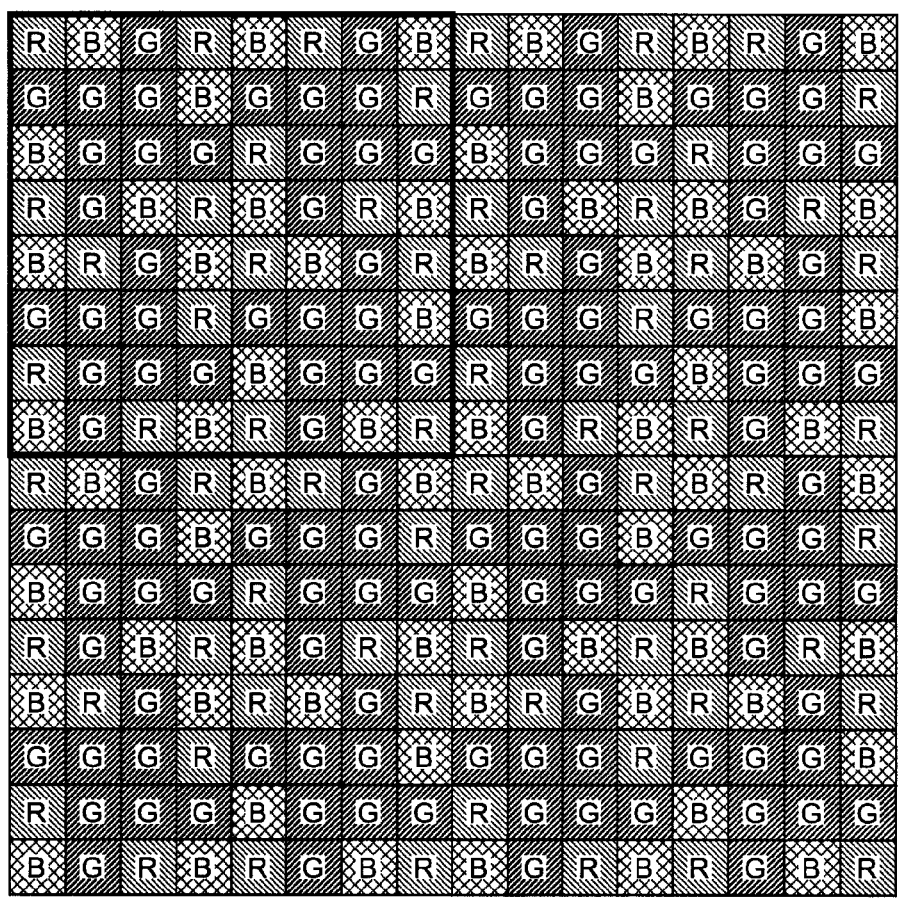
FIG. 11 is a diagram showing a seventh embodiment of the single-plate color imaging element according to the present invention.

FIG. 11 is a diagram showing a seventh embodiment of the single-plate color imaging element according to the present invention. FIG. 11 particularly shows a color filter array of color filters arranged on the color imaging element.

The color filter array of the color imaging element of the seventh embodiment includes a basic array pattern (pattern shown by a thick frame) formed by a square array pattern corresponding to 8×8 pixels, and the basic array pattern is repeatedly arranged in the horizontal and vertical directions.

As in the first embodiment, the color filter array includes G filters arranged in each line in the horizontal, vertical, and oblique (NE, NW) directions of the color filter array and includes R and B filters arranged in each line in the horizontal and vertical directions of the color filter array.

In the basic array pattern of the color filter array shown in FIG. 11, the numbers of pixels of the R pixels, the G pixels, and the B pixels corresponding to the R, G, and B filters in the basic array pattern are sixteen pixels, thirty two pixels, and sixteen pixels, respectively. Therefore, the ratio of the numbers of RGB pixels is 1:2:1, and the proportion of the number of G pixels that most contribute to obtaining the luminance pixels is greater than the proportions of the numbers of each of R and B pixels of other colors.

The color filter array includes a square array corresponding to 2×2 pixels of G filters, and the basic array pattern is point symmetric with respect to the center of the basic array pattern.

When the basic array pattern is divided into four sets of 4×4 pixels, the diagonal arrays of 4×4 pixels are the same, and the positional relationship of the R and B filters is opposite in the arrays of 4×4 pixels adjacent to each other in the horizontal or vertical direction. The rest of the arrangement is the same.

The color filter array of the color imaging element of the seventh embodiment has the same features as the features (1), (2), (3), (4), (5), and (6) of the color filter array of the color imaging element of the first embodiment.

{Eighth Embodiment of Color Imaging Element}

Figure 12:
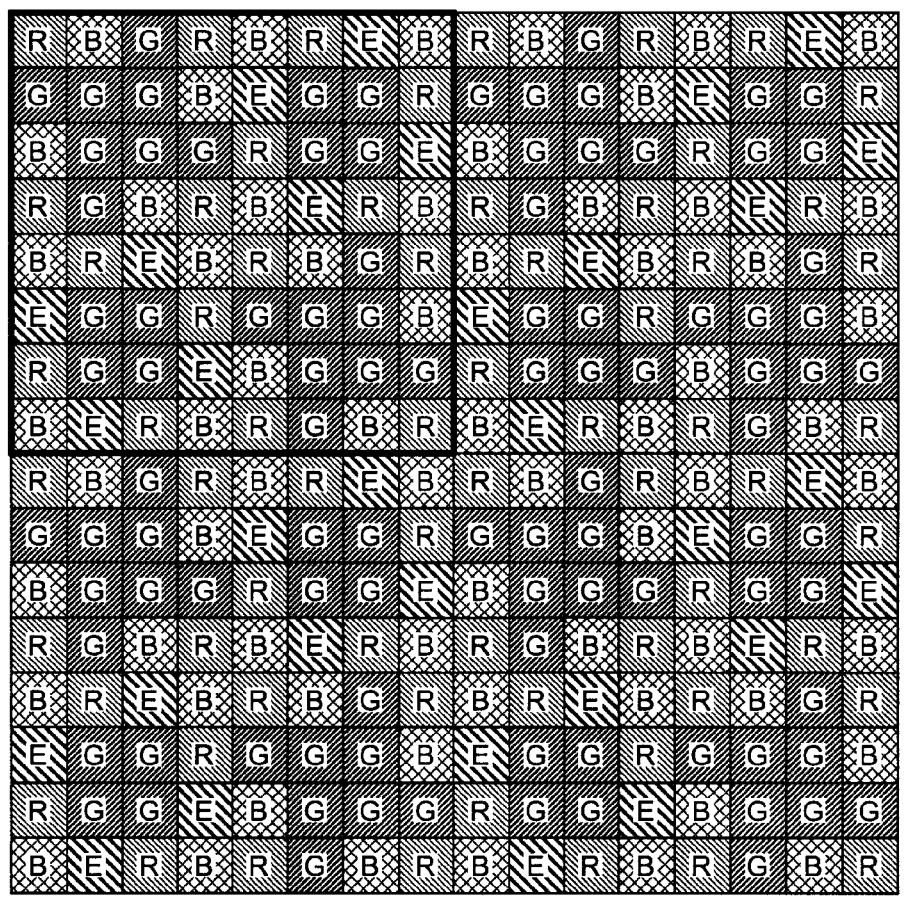
FIG. 12 is a diagram showing an eighth embodiment of the single-plate color imaging element according to the present invention.
Figure 13:
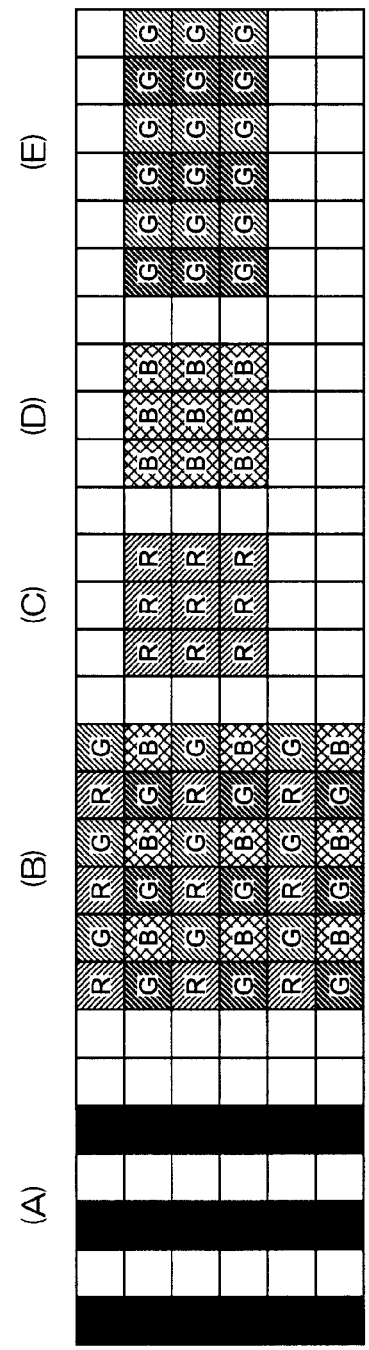
FIG. 13 is a diagram used to explain a problem of a conventional color imaging element with color filters in a Bayer array.
Figure 14:
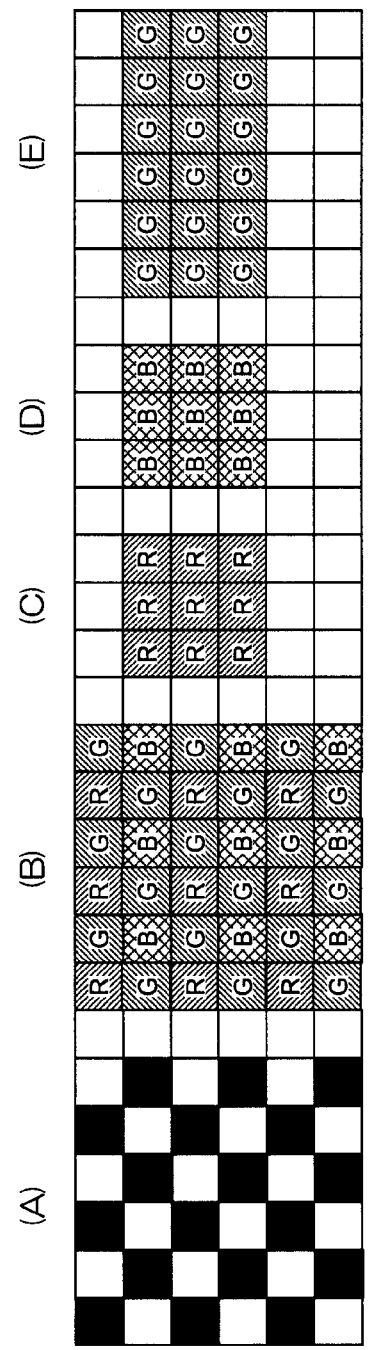
FIG. 14 is another diagram used to explain a problem of a conventional color imaging element with color filters in a Bayer array.

FIG. 12 is a diagram showing an eighth embodiment of the single-plate color imaging element according to the present invention. FIG. 12 particularly shows a color filter array of color filters arranged on the color imaging element.

The color filter arrays of the color imaging element of the first to seventh embodiments are color filter arrays of color filters of three primary colors of RGB. The color filter array of the color imaging element of the eighth embodiment is different in that the array is a color filter array of four color filters including E filters of emerald (E) in addition to the RGB filters.

The color filter array of the color imaging element of the eighth embodiment includes a basic array pattern (pattern shown by a thick frame) formed by a square array pattern corresponding to 8×8 pixels as in the seventh embodiment, and the basic array pattern is repeatedly arranged in the horizontal and vertical directions.

The color filter array includes G filters arranged in each line in the horizontal, vertical, and oblique (NE, NW) directions of the color filter array and includes R filters, B filters, and E filters arranged in each line in the horizontal and vertical directions of the color filter array.

In the basic array pattern of the color filter array shown in FIG. 12, the numbers of pixels of the R pixels, the G pixels, the B pixels, and the E pixels corresponding to the R, G, B, and E filters in the basic array pattern are sixteen pixels, twenty four pixels, sixteen pixels, and eight pixels, respectively. Therefore, the ratio of the numbers of RGBE pixels is 2:3:2:1, and the proportion of the number of G pixels that most contribute to obtaining the luminance signals is greater than the proportions of the numbers of each of R pixels, B pixels, and E pixels of other colors.

The color filter array includes a square array corresponding to 2×2 pixels of G filters, and the basic array pattern is point symmetric with respect to the center of the basic array pattern.

The color filter array of the color imaging element of the eighth embodiment has the same features as the features (1), (2), (3), (4), (5), and (6) of the color filter array of the color imaging element of the first embodiment.

{Others}

Although the color filter arrays with color filters of three primary colors of RGB and the color filter array with color filters of four colors including three primary colors of RGB and another color (for example, emerald (E)) have been described in the embodiments, the types of the color filters are not limited to the embodiments.

The present invention can also be applied to a color filter array with color filters of four complementary colors including G in addition to C (cyan), M (magenta), and Y (yellow) that are complementary colors of the primary colors RGB.

Although the square basic array patterns corresponding to N×N (N: integer 4 or more) are repeatedly arranged in the horizontal and vertical directions in the color filter arrays of the color imaging element of the embodiments, rectangular basic array patterns corresponding to N×M (N, M: integers 4 or more and N≠M) pixels may be repeatedly arranged in the horizontal and vertical directions.

The present invention is not limited to the embodiments, and it is obvious that various changes can be made without departing from the scope of the present invention.

The invention claimed is:

1. A single-plate color imaging element including color filters in a predetermined color filter array arranged on a plurality of pixels formed by photoelectric conversion elements arranged in horizontal and vertical directions, wherein
the color filter array includes a predetermined basic array pattern including first filters corresponding to a first color that most contributes to obtaining luminance signals and second filters corresponding to two or more second colors other than the first color, the basic array pattern repeatedly arranged in the horizontal and vertical directions,
one or more first filters are arranged in all lines in horizontal, vertical, and oblique (NE, NW) directions of the color filter array,
one or more second filters of each color of the two or more second colors are arranged in all lines in the horizontal and vertical directions of the color filter array in the basic array pattern, and
a proportion of the number of pixels of the first color corresponding to the first filters is greater than proportions of the numbers of pixels of each color of the second colors corresponding to the second filters,
wherein there are no pixels between the repeatedly arranged basic array patterns.

2. The color imaging element according to claim 1, wherein
the color filter array includes a section where the first filters continue for two or more pixels in all lines in the horizontal, vertical, and oblique (NE, NW) directions.

3. The color imaging element according to claim 1, wherein
the color filter array in the predetermined basic array pattern is point symmetric with respect to a center of the basic array pattern.

4. The color imaging element according to claim 1, wherein
the predetermined basic array pattern is a square array pattern corresponding to N×N (N: integer 4 or more and 8 or less) pixels.

5. The color imaging element according to claim 4, wherein
the predetermined basic array pattern is a square array pattern corresponding to 6×6 pixels.

6. The color imaging element according to claim 1, wherein
the color filter array includes the first filters at a center and four corners of a 3×3pixel group, and the 3×3 pixel group is repeatedly arranged in the horizontal and vertical directions.

7. The color imaging element according to claim 1, wherein
the second filters are arranged in all lines in the horizontal, vertical, and oblique (NE, NW) directions of the color filter array.

8. The color imaging element according to claim 2, wherein
the second filters are arranged in all lines in the horizontal, vertical, and oblique (NE, NW) directions of the color filter array.

9. The color imaging element according to claim 3, wherein
the second filters are arranged in all lines in the horizontal, vertical, and oblique (NE, NW) directions of the color filter array.

10. The color imaging element according to claim 4, wherein
the second filters are arranged in all lines in the horizontal, vertical, and oblique (NE, NW) directions of the color filter array.

11. The color imaging element according to claim 5, wherein
the second filters are arranged in all lines in the horizontal, vertical, and oblique (NE, NW) directions of the color filter array.

12. The color imaging element according to claim 6, wherein
the second filters are arranged in all lines in the horizontal, vertical, and oblique (NE, NW) directions of the color filter array.

13. The color imaging element according to claim 1, wherein
the first color is green (G), and the second colors are red (R) and blue (B).

14. The color imaging element according to claim 13, wherein
the predetermined basic array pattern is a square array pattern corresponding to 6×6 pixels, and
the color filter array includes: a first array corresponding to 3×3 pixels, the first array including G filters arranged at a center and four corners, B filters vertically arranged across the G filter at the center, and R filters horizontally arranged across the G filter at the center; and a second array corresponding to 3×3 pixels, the second array including G filters arranged at a center and four corners, R filters vertically arranged across the G filter at the center, and B filters horizontally arranged across the G filter at the center, the first and second arrays alternately arranged in the horizontal and vertical directions.

* * * * *